US006630622B2

United States Patent
Konold

(10) Patent No.: US 6,630,622 B2
(45) Date of Patent: Oct. 7, 2003

(54) COMBINED SOLAR ELECTRIC POWER AND LIQUID HEAT TRANSFER COLLECTOR PANEL

(76) Inventor: Annemarie Hvistendahl Konold, 23903 Malibu Knolls Rd., Malibu, CA (US) 90265

( * ) Notice: Subject to any disclaimer, the term of this patent is extended or adjusted under 35 U.S.C. 154(b) by 0 days.

(21) Appl. No.: 10/133,655

(22) Filed: Apr. 26, 2002

(65) Prior Publication Data
US 2002/0121298 A1 Sep. 5, 2002

Related U.S. Application Data

(63) Continuation-in-part of application No. 09/681,124, filed on Jan. 15, 2001, now abandoned.
(51) Int. Cl.[7] ................ H01L 31/052; H01L 31/058
(52) U.S. Cl. ............ 136/246; 136/248; 136/251; 136/291; 52/173.3; 126/623; 126/643; 126/634; 126/700; 126/699; 126/658; 126/661; 126/663; 60/641.8
(58) Field of Search .............. 136/246, 248, 136/291, 251; 52/173.3; 126/623, 643, 634, 700, 699, 658, 661, 663; 60/641.8

(56) References Cited

U.S. PATENT DOCUMENTS

| | | | |
|---|---|---|---|
| 4,069,812 A | * | 1/1978 | O'Neill ............ 136/246 |
| 4,147,157 A | | 4/1979 | Zakhariya |
| 4,315,163 A | | 2/1982 | Bienville |
| 4,373,308 A | | 2/1983 | Whittaker |
| 4,392,008 A | | 7/1983 | Cullis |
| 4,395,582 A | * | 7/1983 | Damsker ............ 136/248 |
| 4,411,490 A | * | 10/1983 | Daniel ............ 126/648 |
| 4,493,940 A | * | 1/1985 | Takaoka ............ 136/248 |
| 4,587,376 A | * | 5/1986 | Kosaka et al. ........ 136/248 |
| 4,607,132 A | * | 8/1986 | Jarnagin ............ 136/248 |
| 5,293,447 A | | 3/1994 | Fanney |
| 5,522,944 A | | 6/1996 | Elazari |
| 5,551,991 A | * | 9/1996 | Avero ............ 136/248 |
| 6,018,123 A | | 1/2000 | Takada |

* cited by examiner

Primary Examiner—Alan Diamond
(74) Attorney, Agent, or Firm—Jack Foy Campbell

(57) ABSTRACT

An apparatus for converting solar energy to thermal and electrical energy including a photovoltaic grid for converting the concentrated solar energy into electrical energy mounted on a copper plate that provides even temperature dispersion across the plate and acts as a thermal radiator when the apparatus is used in the radiant cooling mode; and a plurality of interconnected heat transfer tubes located within the enclosure and disposed on the plane below the copper plate but conductively coupled to the copper plate for converting the solar energy to thermal energy in a fluid disposed within the heat transfer tubes. Fresnel lenses are affixed to the apparatus on mountings for concentrating the solar energy on to the photovoltiac grid and functioning as a passive solar tracker.

22 Claims, 8 Drawing Sheets

COMBINED SOLAR ELECTRIC POWER AND LIQUID HEAT TRANSFER COLLECTOR PANEL

Figure 1:
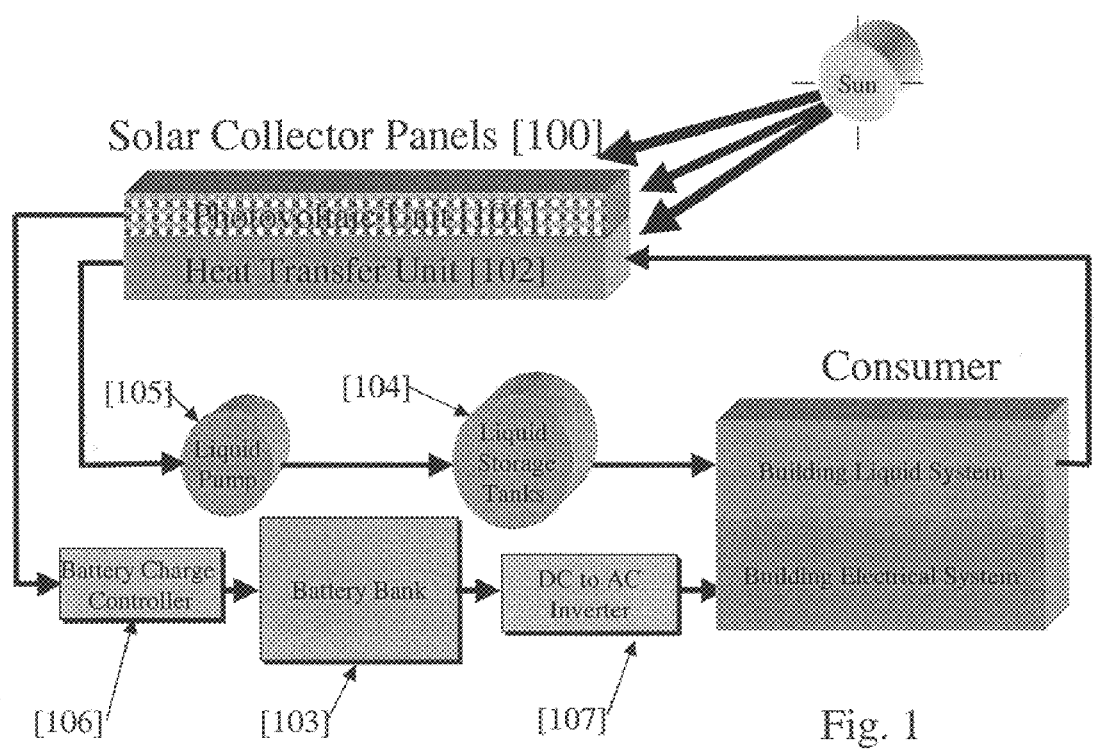

This is a Continuation-in-part of application no. 09/681,124 filed Jan. 15, 2001, now abandoned.

The sole inventor is Annemarie Hvistendahl Konold whose country of citizenship is the U.S.A and resides at: 23903 Malibu Knolls Road, Malibu, Calif. 90265.

CROSS-REFERENCE TO RELATED APPLICATIONS

Portion of the invention described herein was also described in patent application no. 09/681,123, filed. Jan. 15, 2001, now abandoned.

STATEMENT REGARDING FEDERALLY SPONSORED RESEARCH OR DEVELOPMENT—Not applicable

REFERENCE TO A "SEQUENCE LISTING," A TABLE, OR A COMPUTER PROGRAM LISTING APPENDIX SUBMITTED ON A COMPACT DISC—Not Applicable

BACKGROUND OF THE INVENTION (1) Field of the Invention

1. The present invention relates to the use of solar energy for conversion of solar energy to electrical and thermal energy with the added function of radiant cooling for general use with industrial/commercial processes requiring working fluid cooling; and using a heat transfer plate to heat a photovoltaic array to maintain its operating temperature in a range that provides maximum efficiency to improve electrical energy conversion in cold climates or winter conditions.

(2) Description of the Related Art

2. The conversion of solar energy to thermal or electrical energy through the use of systems such as photovoltaic arrays, passive absorbers of solar energy, solar furnaces, trough concentrating collectors with sun trackers is well established in the art. U.S. Pat. No. 4,315,163 describes a multipower electrical system for supplying electrical energy to a house including a solar photovoltaic array, a battery charger and DC to AC inverter. U.S. Pat. No. 4,147,157 describes an active solar energy system comprising an array of solar collectors for both generating power for a pump; and for heating a fluid, a pumping device powered by the array to circulate the heated fluid and a storage tank to contain the heated fluid. Similarly, U.S. Pat. No. 5,293,447 describes a system for heating water using solar energy comprising a photovoltaic array, a water heater and a controller.

3. Systems have also been proposed for simultaneously converting solar energy to thermal and electrical. For example, U.S. Pat. No. 4,392,008 describes a flat plated solar thermal collector below and in spaced conductive relationship to a plate-mounted array of photovoltaic cells. U.S. Pat. No. 5,522,944 describes an apparatus with an array of photovoltaic cells and a plurality of interconnected heat collecting tubes disposed on the same plane with the array.

4. Other systems attempting to optimize electrical energy conversion and provide conversion to thermal energy from solar energy have been proposed. For example, U.S. Pat. No. 4,373,308 describes a solar cell array consisting of individually relatable, elongated segments driven by a sun tracker and motor with a thermal solar collector supported beneath the solar cell array for utilization of solar energy received through a roof opening in a building. U.S. Pat. No. 6,018,123 describes a solar cell module provided at the position of a heat collecting plate inside a heat collector in which hot air can be led into a house while maintaining the performance of solar cells.

5. However, there is an unmet need in the art for improvements to optimize systems that convert solar energy to both thermal and electrical energy efficiently in colder climates adding a function to radiate heat to cool fluids and keep the collectors free of snow and ice.

BRIEF SUMMARY OF THE INVENTION

6. The invention provides enhanced performance characteristics and adds a heat radiator function within a single enclosure that previous inventions do not provide.

7. Included within a single enclosure is a photevoltaic grid that converts solar energy into electrical energy, a thermally conductive heat transfer plate disposed on a plane below the photovoltaic grid. The heat transfer plate converts the solar energy in thermal energy uniformly distributed over the entire plate. On a plane below the plate but thermally coupled to the plate by a thermal conductive compound are copper tubes which impart the thermal energy from the plate to a fluid disposed inside the tube heating the fluid to a high temperature before being discharged from the enclosure.

8. In a radiator mode, a hot fluid is introduced to the copper tubes that absorb the heat form the fluid, cooling the fluid. This thermal energy is conducted from the tubes to the heat transfer plate that radiates the thermal energy through the photovoltaic grid and out through the glass covered top of the enclosure.

9. The capability to convert solar energy to electrical energy and to thermal energy is improved by the addition of a Fresnel lens array supported above the photovoltaic grid by lens support panels riveted to the enclosure. The Fresnel lens magnifies the amount of insolation (solar energy) received by the photovoltaic grid and the thermal transfer plate.

The Fresnel lens is held in place on the lens supports by lens retainer in a manner that imparts a curvature to the lens. This curvature allows the lens to magnify the available insolation regardless of the Sun's position providing a passive solar tracker capability. Thus the need for a Sun tracker sensor, drive electronics and a drive motor coupled to the lens array is not required, saving energy, weight and cost. Testing has shown that the performance of the photovoltaic grid is improved by at least 14 percent using this lens feature.

10. The ability to remove heat from a hot fluid and radiate the heat through the photovoltaic grid and out the enclosure top heats the lens array and the surrounding lens support panels. This heating ability allows operation of the collector in cold climates preventing the build up of ice and snow on the collector.

11. A temperature sensor is provided so that when the sensor output signal is coupled to a microprocessor-based controller, thermostat or Proportional-Integral-Derivative (PID) controller, fluid flow rate can be regulated as a function of its discharge temperature. By this method, fluid discharged from the collector can be maintained at a constant temperature. Since this temperature is also proportional to the photovoltaic grid temperature, the photovoltaic operating temperature can maintained within the preferred range of 70° F. to 100° F. which is the range where the photovoltaic grid is most efficient.

12. Another benefit is provided with the flow of cold fluid through the collector panels, if mounted on a building roof, reduces the roof temperature in the immediate area around the panel enclosure from roof temperatures of 100° F. to 140° F. down to 80° F. to 120° F. depending upon the building environmental conditions. This ability to cool roofs augments or replaces building air conditioning thus providing a savings in building air conditioning costs.

BRIEF DESCRIPTION OF THE SEVERAL VIEWS THE DRAWINGS

13. FIG. 1 is a conceptual depiction of the collector panels installed in a system illustrating the primary components employed to provide simultaneous electric power and heat from a single system using a single set of Solar collection panels.

Figure 2:
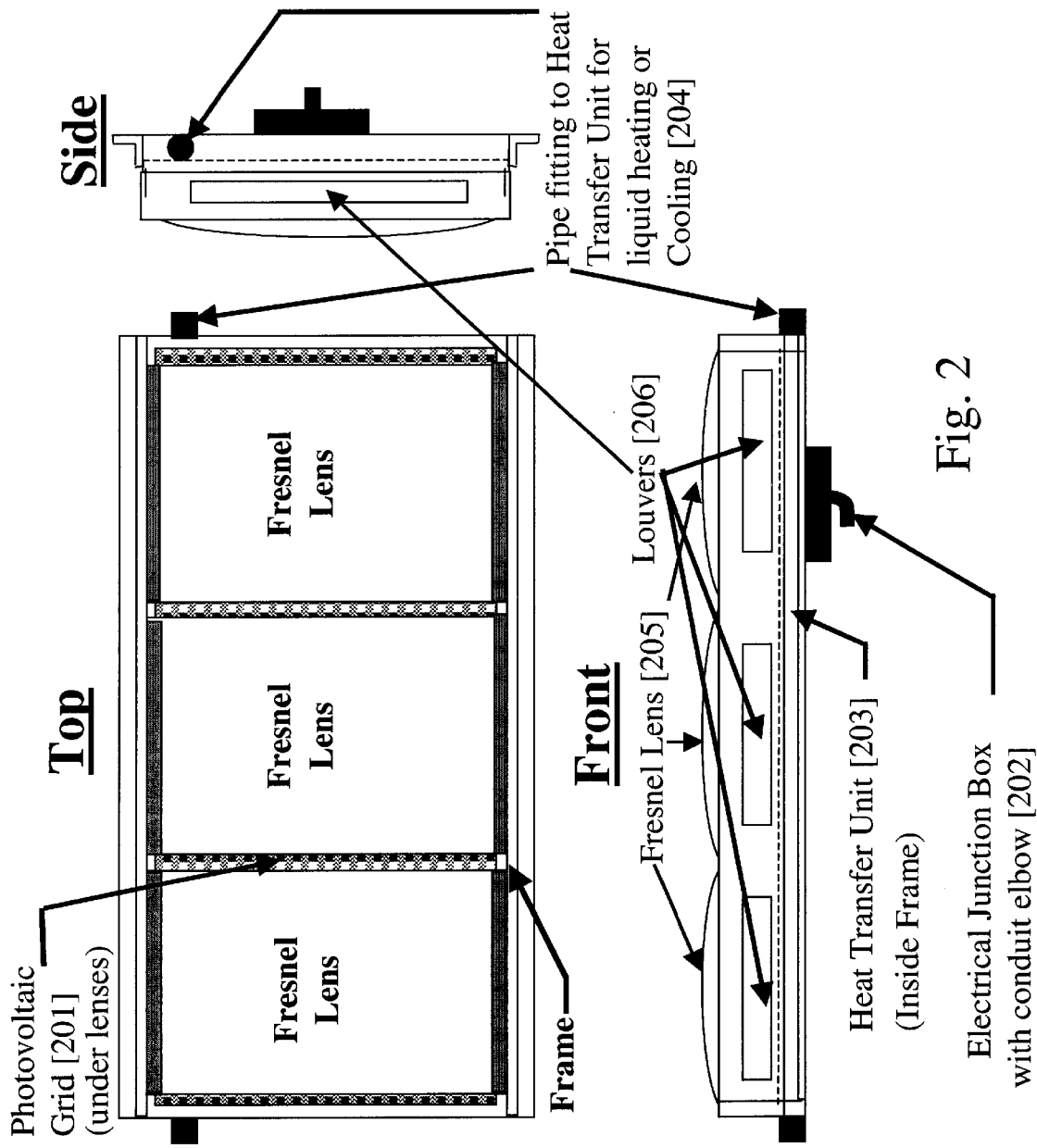

14. FIG. 2 shows the three views of the Collector Panel comprised of the Photovoltaic electric, the heat exchanger, and the Fresnel lens assembly. The electrical and plumbing fittings are provided for interconnection of multiple Solar Collector panel units, and connection of the panels to accompanying electrical energy storage and thermal energy storage or dissipation systems.

Figure 3:
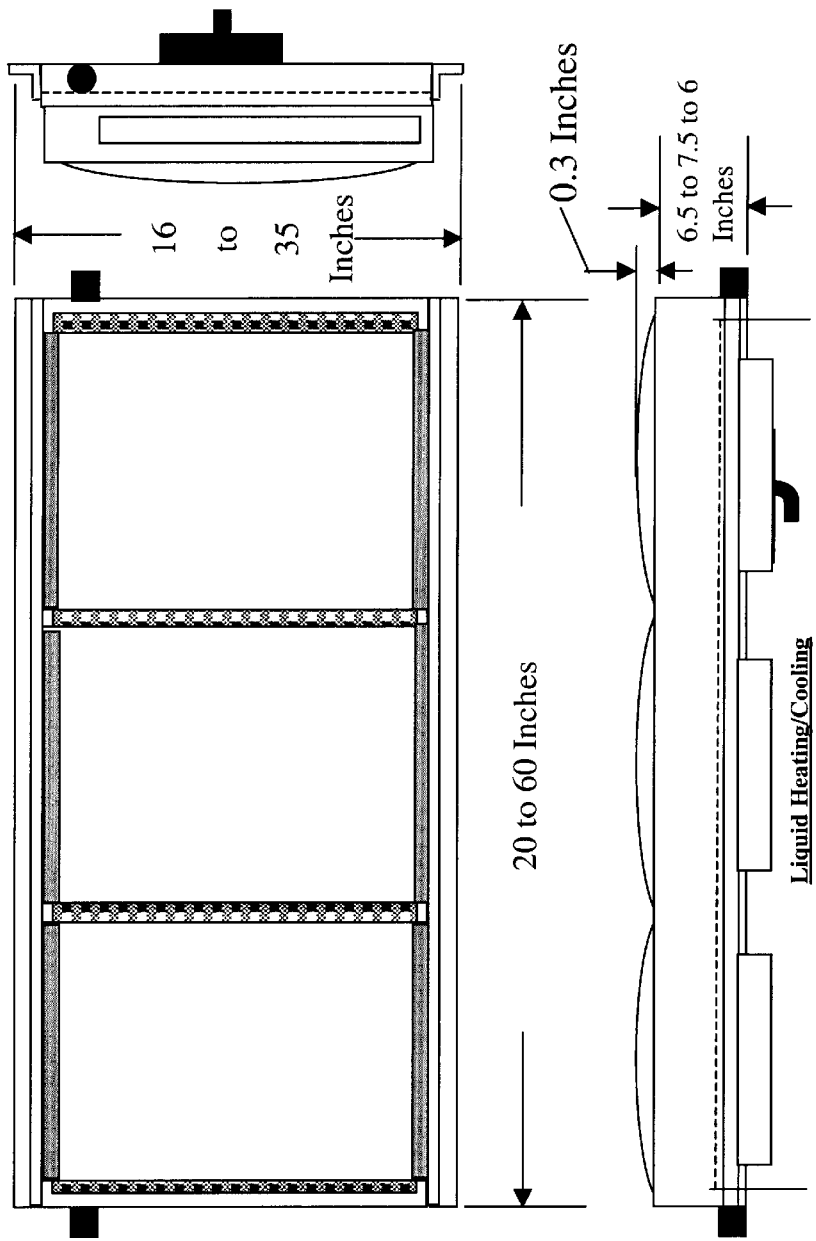

15. FIG. 3 shows the Collector Panel sizes and power & heat capacities for assembly into multiple-panel arrays.

Figure 4:
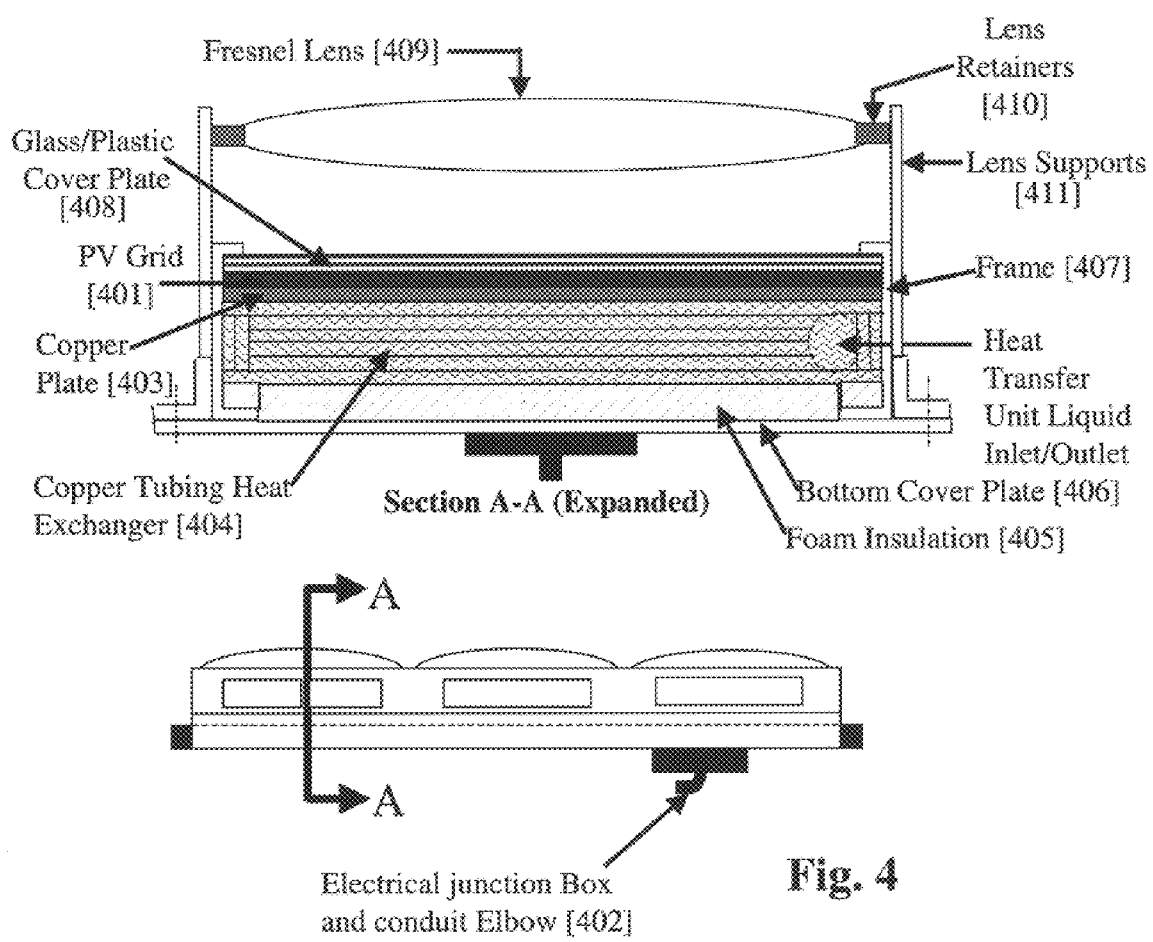

16. FIG. 4 illustrates the internal design of the Collector Panel indicating the integration of the Photovoltaic grid, the heat exchanger, and the Fresnel lens assembly. The Photovoltaic grid and the heat exchanger are interfaced through a copper heat conducting-plate for uniform and efficient heat absorption and radiation.

Figure 5:
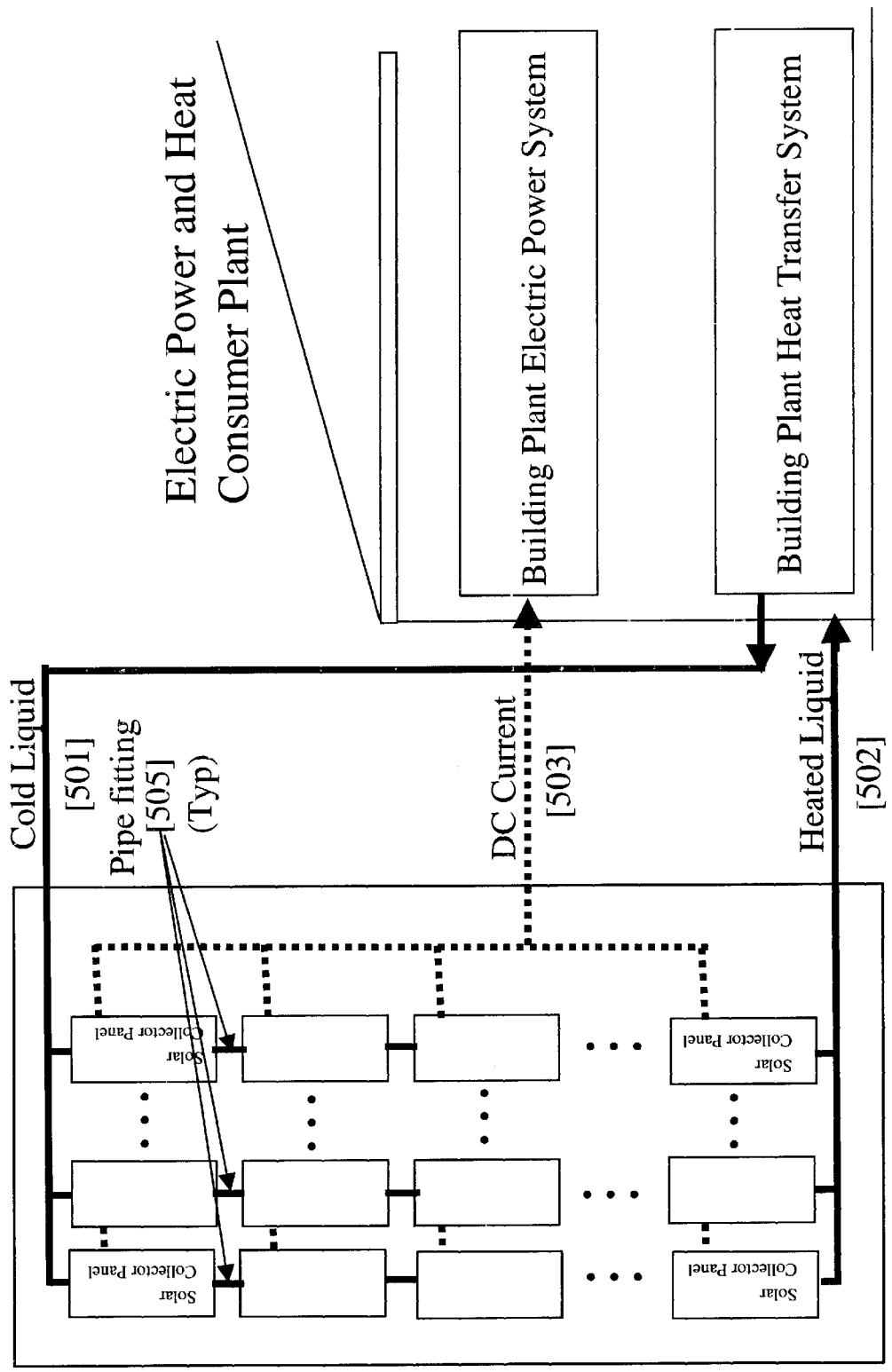

17. FIG. 5 shows the Collector Panel array for simultaneous liquid heating and/or panel warming and electric poster generation. Cold liquid flows from the consumer's plant into the panels and heated liquid flows out of the panels into the consumer's plant. Electric current flow to the consumer's plant is included.

Figure 6:
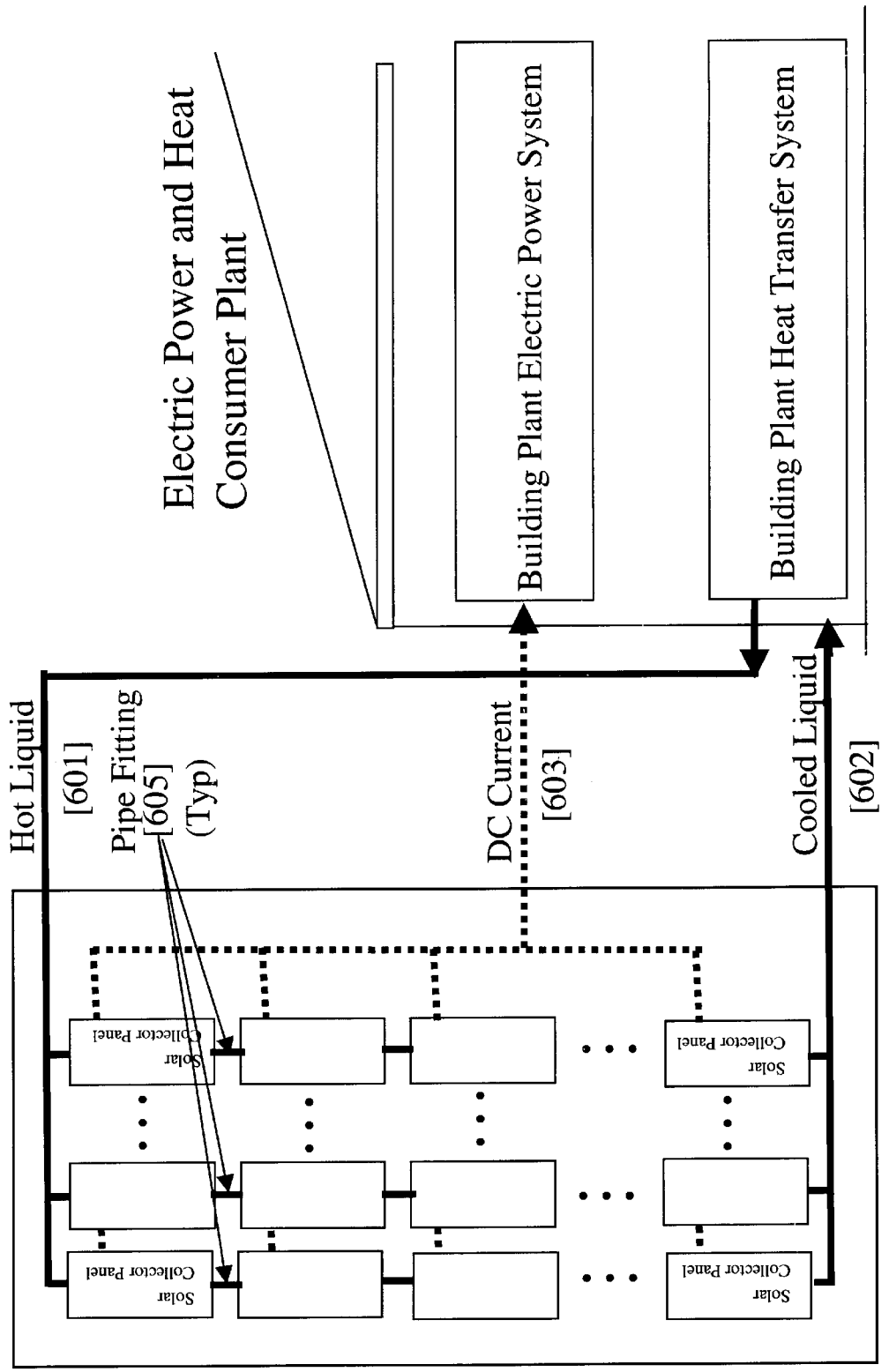

18. FIG. 6 shows the Collector Panel array for simultaneous liquid cooling and/or Collector Panel warming and electric power generation. Hot liquid flows from the consumer's plant into the panels and cooled liquid flows out of the panels into the consumer's plant. Electric current flow to the consumer's plant is included.

Figure 7:
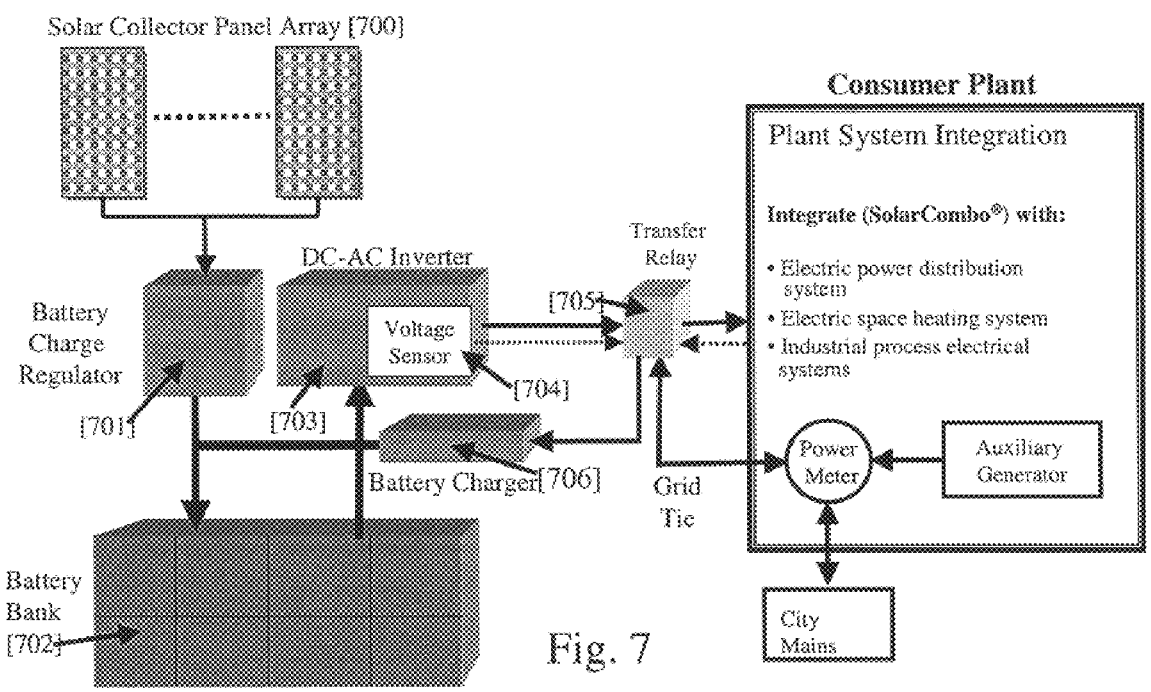

19. FIG. 7 shows the components provided and their connection for the electrical segment of the Collector panel, including a list of consumer plant systems with which the electrical segment is integrated.

Figure 8:
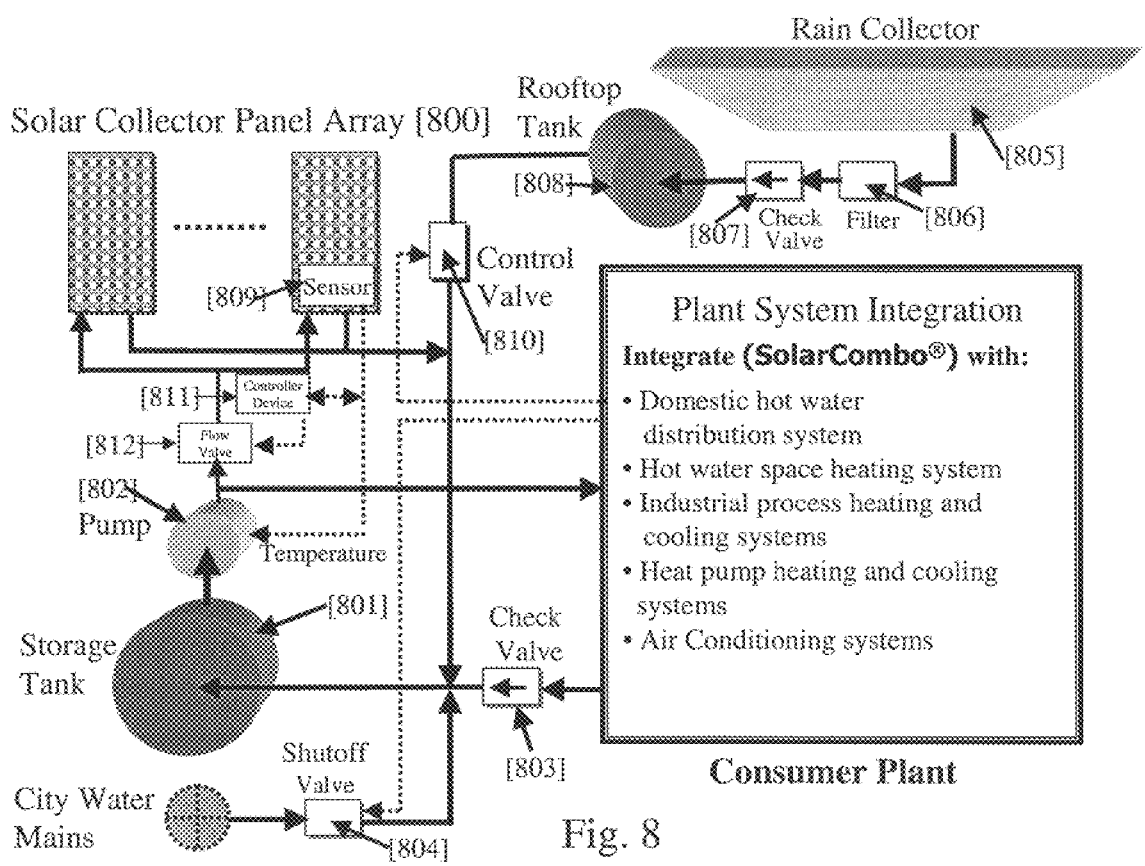

20. FIG. 8 shows the components provided and their connection for the heat transfer segment of the Collector panel, including a list of consumer plant systems with which the heat transfer segment is integrated.

DETAILED DESCRIPTION OF THE INVENTION

21. The invention employs a Solar Collector Panel [100] that is a self-contained, compact Solar Photovoltaic and heat energy absorption and dissipation unit that provides electric power and liquid heat transfer from within a single integrated unit. The heat Transfer Unit [102]. [203] includes a copper plate [403] and a copper tubing heat exchanger [404]. Typically, solar collector panels [100] are integrated within a system to provide a heated liquid for a building liquid system and simultaneously provide electrical power for a building electrical system. As shown in FIG. 1, a photovoltaic unit [101] portion of a panel has its electrical output connected to a battery charge controller [106] which charges a battery bank [103] which, in turn, drives a DC to AC inverter [107] providing useful AC electrical power that is fed into the building electrical system. There are numerous variations of this arrangement that are well understood in the art. Also shown in FIG. 1, is the heat transfer unit [102] whose liquid discharge is connected to a closed liquid loop pressurized by a liquid pump [105] that pumps the heated liquid into liquid storage tanks [104] and then out to the building liquid system for heated liquid fluid use, returning cooler liquid to a liquid input of the panel There are also numerous variations of this arrangement that are well understood in the art.

22. FIG. 2 shows the three views of the Solar Collector Panel [100] comprising the Photovoltaic (PV) grid [201], [401], the copper tubing heat exchanger [404], and the Fresnel lens [205],[409] assembly. The Fresnel lens [205], [409] assembly is employed to increase the Solar electric and heat energy capturing capacity of the panel. Initial testing indicates that the increase is as much as 14 percent above conventional solar electric and heating panels. Through its shape, the Fresnel lens [205], [409] assembly also provides static Sun tracking to maximize solar energy capture, without the use of mechanical rotating or positioning mechanisms. The Fresnel lens [205], [409] provide this enhancement on days of partial overcast as well as on Sunny days. As seen in FIG. 3, the Solar Collector Panel [100] is provided in a range of sizes and capacities to provide flexibility in grouping of arrays to meet consumer energy requirements.

23. FIG. 4 gives the detailed design of the integrated Solar Collector Panel [100]. As shown in the panel Section A—A, a copper plate [403] is mated between the Photovoltaic (PV) grid [201], [401] substrate and the copper tubing heat exchanger [404] to uniformly absorb incoming heat from the Sun and distribute it to the copper tubing heat exchanger [404]. Similarly, the copper plate [403] uniformly distributes heat from the copper tubing heat exchanger [404] to the Photovoltaic (PV) grid [201], [401] substrate for radiation to the atmosphere when the Solar Collector Panel [100] is connected for heat dissipation. Foam insulation [405] lies between the copper tubing heat exchanger [404] and the bottom cover plate [406] to reduce heat leakage from the Solar Collector Panel [100], retaining maximum heat for transfer to or from the user plant.

24. An anodized aluminum frame [407] has attached to the bottom of the frame along the length of a first long side and a second long side, an L-shaped aluminum channel with mounting holes disposed evenly across the length of the channel. These mounting holes allow for the fastening of the collector panel frame to a footing or building roof using standard bolts. Rivets attach the L-channels.

25. In a similar manner, aluminum lens supports [411] are riveted along the length of each side of the frame [407]. The height of these supports are selected to allow positioning of the lens assembly 6.5 to 7.5 inches above a bottom surface of a glass/plastic cover plate [408] depending upon the panel size or 5.5 inches above a top surface of the glass/plastic cover plate [408]. This distance was selected to ensure that the focal point of the Fresnel lens [205], [409] lies below the plane of the photovoltaic grid [201], [401] so that hot spots due to insolation magnification don't form on the grid.

26. As seen in FIG. 2, openings, or louvers [206], are provided in the lens supports [411] with movable sections to control air and rain flow across the grid surface. For cold climate installation, the louvers [206] are opened for maximum heat radiation, airflow, and release of impingent snow and ice. For warm climate installation, the lens support louvers [206] are closed to preclude the leakage of captured heat, which would otherwise be caused by airflow across the grid surface.

27. Along the top inside edge, evenly disposed along the full length of each lens support [411] are lens retainers [410] fastened to the lens supports [411] by screws. Each lens retainer [410] has a grove sized to receive the edge of the Fresnel lens [205], [409] similar to a tongue and grove fitting to hold the lens firmly in position. The lens retainers [410] are fabricated either from a hard rubberized material or plastic. In the preferred embodiment, the lens retainers [410] are plastic. Each short side of each Fresnel lens [205], [409] is secured to the lens retainers [410] in this manner. The length of each lens retainers [410] matches the length of each Fresnel lens [205], [409] short side dimension.

28. As shown in FIG. 4, View A—A, the solar collector panel [100] is constructed as a sandwich of component layers. The first layer is the glass/plastic cover plate [408] held in place by the overlaying lip formed on the top of the frame [407] side members. In the preferred embodiment the cover plate [408] is made from glass but it can be plastic. Mounted below the cover plate [408] is the photovoltaic (PV) grid [401]. The photovoltaic grid [401] is a commercial unit available from Kyocera, Siemens and BP. Below that is mounted the heat transfer copper plate [403] for uniform and efficient heat absorption and radiation. In the preferred embodiment the plate is made from copper. For maximum heat transfer, a copper tubing heat exchanger [404] is bonded to the heat transfer copper plate [403] using a thermal conducting compound. In the preferred embodiment, the copper tubing heat exchanger [404] is made from copper tubing and the compound is a copper-filled epoxy.

29. Foam insulation [405] lies between the copper tubing heat exchanger [404] and the frame [407] bottom cover plate [406]. Rivets secure the bottom cover plate [406] so that the entire collector panel sandwich is firmly held in place.

30. The above-unsealed Solar Collector Panel [100] is designed to be a self-contained, compact Solar Photovoltaic and heat energy absorption and dissipation unit that provides electric power and liquid heat transfer from within a single integrated unit 31. Plenum, high temperature rated cabling 200° C., 14 gauge is attached to the photovoltaic grid [201], [401] and brings the electrical energy out to the electrical function box and conduit elbow fitting [202], [402]. Connections to the Photovoltaic grid are made through the electrical junction box and conduit elbow fitting [202], [402]. Signal cabling from the discharge temperature sensor [809], described below, is also brought through the electrical junction box and conduit elbow fitting [202], [402]. The electrical junction box and conduit elbow fitting [202], [402] facilitates the connection of any number of Collector Panels [100] into arrays [700], [800] as illustrated in FIGS. 5, 6, 7, and 8.

32. Connections to the copper tubing heat exchanger [404] are through standard pipe thread fittings [204], [505], [605]. The pipe thread fittings [204], [505], [605] facilitate the joining of any number of Collector Panels [100] into arrays [700], [800] as illustrated in FIGS. 5 and 6. The copper tubing heat exchanger [404] of the Collector Panel [100] accommodates any non-corrosive liquid.

Photovoltaic Electric Power Segment

33. As shown in FIG. 7, electric current is drawn from the photovoltaic grid [201], [401] of the collector panels [100] and delivers DC current [503], [603] to operate electrical apparatus. This DC current [503], [603] is connected to a building plant electrical power system as shown in FIG. 6 to charge batteries that store energy for subsequent use. Such battery charging systems with DC to AC conversion systems are well understood in the art.

34. In general, battery charge regulators [701] keep the battery bank [702] charged, prevent overcharging, and regulate electric current flow from the photovoltaic grid [201], [401] to the battery bank [702]. Battery output current is supplied to one or more DC to AC inverters [703] to convert DC battery power to AC power to supply power at the required voltage and frequency to operate consumer electrical apparatus. A battery voltage sensor [704] may be provided to determine when the Solar array power is not sufficient to keep the battery bank [702] fully charged to satisfy consumer power demand, at which time it activates a transfer relay [705] to connect the battery charger [706] to city mains or a consumer auxiliary generator for additional power. The consumer can be provided with additional control of the transfer relay [705] to direct city mains power to his plant and/or feed unused solar power from the DC to AC Inverter [703] back to the city utility grid.

35. The electrical junction box and conduit elbow [202], [402] facilitate the joining of any number of Collector Panels [100] into arrays [700], [800] as illustrated in FIGS. 5 and 6. By the means described above, the Collector Panel array is integrated with consumer electric systems such as power distribution, electric space heating, and industrial process power and control systems thus replacing or augmenting the electrical components of these systems.

Heat Transfer Segment

36. In a warm or hot climate, as shown in FIG. 5, a liquid is heated fort household or commercial domestic use. Similarly, a liquid is heated for an industrial or commercial manufacturing process. Cold liquid [501] flows from a consumer's plant into the panels and heated liquid [502] flows out of the panels' into the consumer's plant. As illustrated in FIG. 8, an array of the Collector Panels [700], [800] may be integrated with consumer plant systems such as an Air Conditioning or a heat pump system to add or remove heat, thus replacing or augmenting the heat transfer components of these systems.

37. Controlling fluid flow in consumer plant heat transfer systems is generally understood in the art. Check valves [803], [807] provide liquid flow in a single direction to prevent the flow directly from the source into the consumer plant. A shutoff valve [804] can be provided for consumer control of incoming liquid. A control valve [810] is often provided for consumer control of liquid flow to and from storage tanks [801], such as rooftop tanks [808] combined with a rain collector [805], filter [806], and check valve [807]. The roof top tank [808] provides plant liquid pressurization in the absence of other sources of pressurization, such as city water.

38. In a cold climate, as shown in FIG. 6, a liquid is cooled for industrial processes or machines such as a stationery engine. Hot liquid [601] flows from a consumer's plant into the panels and cooled liquid [602] flows out of the panels into the consumer's plant. A rooftop may be heated through the Collector Panels [100] to reduce snow and ice build-up, and keep the Collector Panels [100] free of snow and ice.

39. Depending upon the climate where the Collector Panel array [700], [800] is installed, heat is removed from or added to the Panels improving their Photovoltaic efficiency, minimizing thermal stress and material deterioration to yield maximum lifetime, and providing a cooled or heated liquid for the consumer at the same time. Consumer plant liquid flow and temperature control and thermal energy storage or dissipation is provided through a temperature sensor [809] included as part of the Collector Panel [100]. The sensor is an integral part of the Collector Panel [100] for domestic, industrial, and commercial system/process controls. The sensor analog output signal can be interfaced to a controller device [811] which can be a process control microprocessor, programmable controller, or Proportional-Integral-Derivative (PfD) 3-mode controller whose output controls a proportional flow control valve to control liquid flow as a function of collector panel discharge flow temperature. The Panel photovoltaic grid temperature is thus maintained within an optimal operating range of 70 to 100 degrees F. Additionally, the sensor analog output signal and the controller device analog output signal can also interface with a pump [802] that pumps the liquid through the liquid flow closed loop.

I claim:

1. A collector panel assembly for thermal radiant cooling and for simultaneously converting solar energy to electrical power and thermal energy comprising:

a rectangular frame with an open top and an open bottom, a first closed long side and a second closed long side, a first closed short side and a second closed short side;

L-shaped channels secured to the bottom of the frame by a fastening means on the first long side and the second long side of the frame, with mounting holes disposed across the length of the channels that allows fastening of the frame to a footing or a building roof;

a cover plate that transmits solar energy sized to fit said open top of the rectangular frame that includes a top surface and a bottom surface;

a photovoltaic grid located within said rectangular frame below the cover plate for converting solar energy transmitted into the rectangular frame through said top cover into electrical energy;

a thermal collecting/radiator plate, located within said rectangular frame on a plane below the photovoltaic grid, for converting solar energy transmitted into the rectangular frame through said top cover into thermal energy;

a copper tubing heat exchanger containing a plurality of interconnected heat collecting copper tubes located within said rectangular frame disposed on a plane below the thermal collecting/radiator plate but conductively coupled to the plate through a thermally conductive material that collects thermal energy from the plate and imparts that thermal energy in a fluid disposed within the heat collecting copper tubes to provide a source of thermal energy;

a pipe thread fitting that penetrates the first short side of the frame, that is connected internally to the copper tubes of the copper tubing heat exchanger, and serves as a fluid inlet;

a pipe thread fitting that penetrates the second short side of the frame, that is connected internally to the copper tubes of the copper tubing heat exchanger, and serves as a fluid outlet;

a bottom cover plate with an interior surface and an exterior surface that is secured to the open bottom of the frame by a fastening means with the dimensions of the cover plate sized to fully cover the open frame bottom and the L-shaped channels on the first long side and the second long side of the frame;

electrical energy distribution cabling for collecting electrical power from the said photovoltaic grid and transferring it out of the rectangular frame though an interface with a building plant electrical power system;

a temperature sensor mounted on the pipe thread fitting of the fluid outlet of said rectangular frame for use in discharge fluid temperature control and for photovoltaic grid temperature control;

lens supports mounted on each side of said rectangular frame whose length matches each side of the frame, and each with an inside surface, that is in contact with the frame and secured to the frame by a fastening means, an outside surface, and a plurality of substantial openings;

a plurality of lens retainers secured by a fastening means disposed on said inside surface of the lens supports that correspond to the first long side and the second long side of the rectangular frame, with mounting height range from 6.5 to 7.5 inches above the bottom surface of the frame cover plate or 5.5 inches above the frame cover plate top surface who's length equals the short side dimension of a Fresnel lens and;

a Fresnel lens assembly consisting of a plurality of Fresnel lenses each with a first and second long side, a first and second short side, and are held in place by inserting each edge of the lens' first and second short sides into a corresponding lens retainer grove.

2. A collector panel assembly of claim 1 where said rectangular frame is made from aluminum.

3. A collector panel assembly of claim 1 where said substantial openings are covered with movable louvers.

4. A collector panel assembly of claim 1 where the interior surface of the bottom cover plate of the rectangular frame is covered with a thermal insulating material.

5. A collector panel assembly of claim 1 where said top cover is made of glass.

6. A collector panel assembly of claim 1 where said top cover is made of plastic.

7. A collector panel assembly of claim 1 where said thermal collecting/radiator plate is made from copper.

8. A collector panel assembly of claim 1 where said thermally conductive material is an epoxy paste impregnated with copper.

9. A collector panel assembly of claim 1 where said interface with a plant electrical power system consists of an electrical junction box and conduit elbow located on the exterior surface of the bottom cover plate of the rectangular frame.

10. A collector panel assembly of claim 1 where the fluid inlet and fluid outlet are standard threaded brass half inch pipe fittings.

11. A collector panel assembly of claim 1 where the Fresnel lenses are 0.3 inches thick.

12. A collector panel assembly of claim 1 where the Fresnel lenses are made from a plastic material.

13. A collector panel assembly of claim 1 where said lens retainers are made from plastic.

14. A collector panel assembly of claim 1 where said lens supports are made from aluminum.

15. A collector panel assembly of claim 1 where said temperature sensor is a resistance sensor.

16. A collector panel assembly of claim 14 where said lens supports have a width sized to allow a Fresnel lens stand-off distance ranging from 6.5 to 7.5 inches above the bottom surface of the top cover of the rectangular frame.

17. A collector panel assembly of claim 4 where said thermal insulating material is foam.

18. A method of controlling discharge temperature of the collector panel assembly of claim 1 comprising the steps of:

converting fluid temperature to a resistance value by the temperature sensor;

converting the resistance value of the sensor to an analog voltage using a bridge circuit within a microprocessor-based controller device;

converting the analog voltage into a digital voltage using an analog to digital converter within a microprocessor-based controller device;

performing a Proportional-Integral-Derivative (PID) control calculation converting temperature value to a proportional flow rate within a microprocessor-based controller device;

setting an analog output value representative of desired fluid flow rate within a microprocessor-based controller device;

sending said analog output value to a proportional valve and positioner over a pair of wires;

positioning a flow control valve position with the valve positioner and;

adjusting valve trim to desired flow rate by a mechanical connection to the positioner.

19. The method of claim 18 where the discharge temperature is set to a temperature that sets a proportional temperature of the photovoltaic rote grid to a range of 70° to 100° F.

20. A method of controlling roof temperature when the collector panel assembly of claim 1 is mounted on a building roof comprising the steps of:

flowing a hot fluid into the copper tubing heat exchanger; removing heat from the fluid by the copper tubes of the copper tubing heat exchanger and conducting the heat to the thermal collecting/radiator plate and;

radiating the heat out through the collector panel assembly, heating the surrounding roof area.

21. The method of claim 20 wherein the heat is used to melt ice and snow on the collector assembly and surrounding roof.

22. A method of cooling roof temperature when the collector panel assembly of claim 1 is mounted on a building roof comprising the steps of:

flowing a cool fluid into the copper tubes of the copper tubing heat exchanger and conducting heat away from the thermal collecting/radiator plate which cools and; absorbing the heat from the collector panel assembly, cooling the surrounding roof area.

* * * * *